US008797056B2

(12) United States Patent
Khoche et al.

(10) Patent No.: US 8,797,056 B2
(45) Date of Patent: Aug. 5, 2014

(54) SYSTEM AND METHOD FOR ELECTRONIC TESTING OF PARTIALLY PROCESSED DEVICES

(75) Inventors: Ajay Khoche, San Jose, CA (US); Erik Volkerink, Palo Alto, CA (US)

(73) Assignee: Advantest (Singapore) PTE Ltd, Singapore (SG)

( * ) Notice: Subject to any disclaimer, the term of this patent is extended or adjusted under 35 U.S.C. 154(b) by 0 days.

(21) Appl. No.: 14/003,414

(22) PCT Filed: Mar. 22, 2011

(86) PCT No.: PCT/US2011/029444
§ 371 (c)(1),
(2), (4) Date: Sep. 5, 2013

(87) PCT Pub. No.: WO2012/128760
PCT Pub. Date: Sep. 27, 2012

(65) Prior Publication Data
US 2014/0002121 A1  Jan. 2, 2014

(51) Int. Cl.
*G01R 31/20* (2006.01)
(52) U.S. Cl.
USPC ............. 324/754.03; 324/754.01; 324/757.04
(58) Field of Classification Search
CPC  H01L 22/14; H01L 22/20; G01R 31/318513; G01R 31/2851
USPC ...................................... 324/750.3
See application file for complete search history.

(56) References Cited

U.S. PATENT DOCUMENTS

| 2007/0296073 | A1 | 12/2007 | Wu et al. |
| 2009/0224784 | A1 | 9/2009 | Pagani |
| 2009/0319968 | A1 | 12/2009 | Wang |
| 2010/0257495 | A1 | 10/2010 | Wu |
| 2012/0126846 | A1* | 5/2012 | Jong et al. ................ 324/762.03 |

OTHER PUBLICATIONS

Press, Ron, "A flexible test strategy for 3D ICs" Electronic Engineering Journal, Mar. 6, 2014, p. 1-6.*
International Search Report and Written Opinion issued in PCT/US2011/029444 on Dec. 16, 2011.

* cited by examiner

*Primary Examiner* — Thomas F Valone
(74) *Attorney, Agent, or Firm* — Manuel de la Cerra

(57) ABSTRACT

Systems and methods are provided for testing partially completed three-dimensional ICs. Example methods may incorporate one or more of the following features: design for testing (DFT); design for partial wafer test; design for partial probing; partial IC probecards; partial IC test equipment; partial IC quality determinations; partial IC test optimization; and partial test optimization. Other aspects may also be included. Systems and methods incorporating these features to test partially completed three-dimensional ICs may result in saved time and effort, and less scraped material, as the partial device is not built any further when a bad partial device is detected. This results in lower costs and higher yield.

21 Claims, 13 Drawing Sheets

SYSTEM AND METHOD FOR ELECTRONIC TESTING OF PARTIALLY PROCESSED DEVICES

CROSS REFERENCE TO RELATED APPLICATIONS

The present invention is filed under 35 U.S.C. §371 as the U.S. national phase of International Application No. PCT/US2011/029444, filed Mar. 22, 2011, which is hereby incorporated in its entirety including all tables, figures and claims.

1.0 BACKGROUND

Semiconductor integrated circuit (IC) chips are typically tested during manufacturing to verify that they function appropriately and reliably. This is often done when the semiconductor chips are still in wafer form, that is, before they are diced from the wafer and packaged. This allows the simultaneous testing of many semiconductor chips in parallel, creating considerable advantages in cost and process time compared to testing individual chips once they are packaged. If chips are found to be defective, they may be discarded when the chips are diced from the wafer, and only the reliable chips need be packaged. Alternatively, semiconductor chips may be tested after dicing, but before packaging by assembling die on tape or a mechanical carrier.

In certain applications IC chips 100 are stacked and interconnected in three-dimensional columns 110, for instance as shown in FIG. 1. Typically, two types of process flows are used to create three-dimensional ICs. In the first typical process flow 200, shown in FIG. 2, fabrication 210 creates silicon wafers 220, which are then tested 230. After testing 230, individual dice 250 are cut or "singulated" 240, then assembled 260 into three-dimensional stacks 270. The three-dimensional stacks 270 are then tested 280. Thus, in this first process flow 200, the individual dice 250 are singulated 240 prior to assembly 260 of the dice 250 into three-dimensional columns 270.

In the second typical process flow 300, shown in FIG. 3, fabrication 310 creates silicon wafers 320, which are then tested 330. But then after testing 330, the wafers 320 are then stacked 340, and then the stacked wafers are tested 350. After the stacked wafers are tested 350, then they are cut or "singulated" 360 into individual stacked or three-dimensional columns of ICs 370, which are then tested again 280. Thus, in this second process flow 300, the three-dimensional columns 370 are singulated 360 after the wafers 320 are assembled 340.

As shown in FIGS. 2 and 3, the dies or "dice" that make up a three-dimensional IC 270, 370 are tested 230, 330 in isolation before being assembled into a three-dimensional IC 270, 370. The assembled three-dimensional ICs 270, 370 are then tested again 280, 380 at the end of the processes for a final quality determination. This current methodology of testing the assembled three-dimensional ICs 270, 370 only after they are completely assembled leads to entire three-dimensional ICs 270, 370 being deemed bad if any of the Individual ICs 100 are bad or an error is introduced during the assembly process at any step. This results in three-dimensional ICs 270, 370 tending to have high scrap rates, high repair costs, and low yields, wasting time and material.

It would be advantageous if there were a way to test the three-dimensional ICs 270, 370 as they were being assembled, in partially completed stages, to more quickly identify bad dies or processing errors that will eventually lead to the failure of a completed three-dimensional stack of ICs 270, 370. This would avoid the wasted, time effort and materials spent completing the manufacture of three-dimensional ICs 270, 370 that are doomed to fail due to a bad die or process step. However, testing of partially competed three-dimensional ICs is not done today as part of the manufacturing flow 200, 300.

2.0 SUMMARY

The following summary is provided to show examples of the invention and not to define or otherwise limit the scope of the invention. Disclosed are example systems and methods designed to enable a person of skill in the art to introduce testing of partially completed three-dimensional ICs 270, 370 into the manufacturing process, such as, for example, manufacturing flows 200, 300.

Example methods may incorporate one or more of the following features: design for testing (DFT); design for partial wafer test; design for partial probing; partial IC probecards; partial IC test equipment; partial IC quality determinations; partial IC test optimization; and partial test optimization. Other aspects may also be included. Systems and methods incorporating these features to test partially completed three-dimensional ICs may result in saved time and effort, and less scraped material, as the partial device is not built any further when a bad partial device is detected. This results in lower costs and higher yield.

3.0 BRIEF DESCRIPTION OF THE DRAWINGS

FIG. 6-1 shows a perspective view of a partially completed stacked or three-dimensional IC incorporating example means for three-dimensional DFT.

FIG. 6-2 shows a perspective view of a partially completed stacked or three-dimensional IC and example circuitry incorporating DFT for interconnect testing.

FIG. 6-3 shows example circuitry incorporating DFT for interconnect testing of a partially completed stacked or three-dimensional IC.

FIG. 6-4 shows example circuitry incorporating DFT for interconnect testing, namely testing through a scan chain, of a partially completed stacked or three-dimensional IC.

FIG. 6-5 shows example circuitry incorporating DFT for interconnect testing, namely oscillation interconnect testing, of a partially completed stacked or three-dimensional IC.

FIG. 7-1 shows a perspective view of a partially completed stacked or three-dimensional IC incorporating example design for wafer test means for three-dimensional DFT.

FIG. 7-2 shows a perspective view of a partially completed stacked or three-dimensional IC incorporating alternative example design for wafer test means for three-dimensional DFT.

Figure 1:
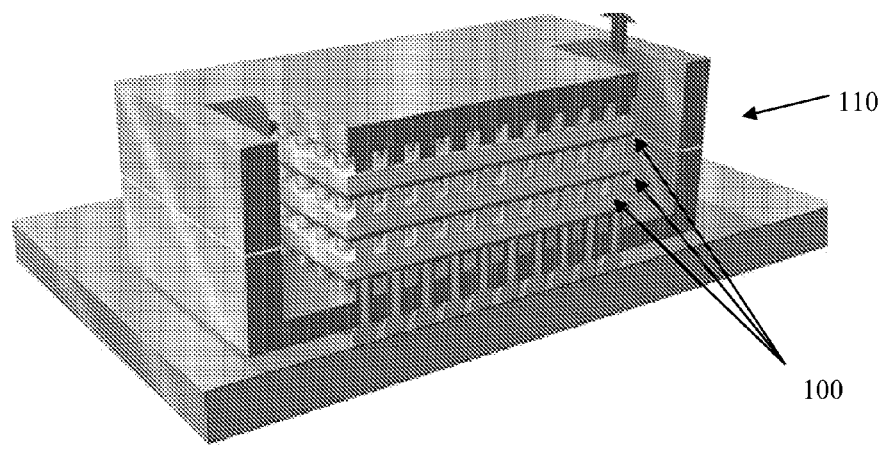
FIG. 1 shows a perspective view of a stacked or three-dimensional IC.

It is noted that, in the following description, like reference numbers appearing in different drawing figures refer to like elements/features. Often, therefore, like elements and features that appear in different drawing figures will not be described in detail with respect to each of the drawing figures.

4.0 DETAILED DESCRIPTION

This specification describes exemplary embodiments and applications of the invention. The invention, however, is not limited to these exemplary embodiments and applications or to the manner in which the exemplary embodiments and applications operate or are described herein. The invention is defined only by the language of the claims.

Figure 4:
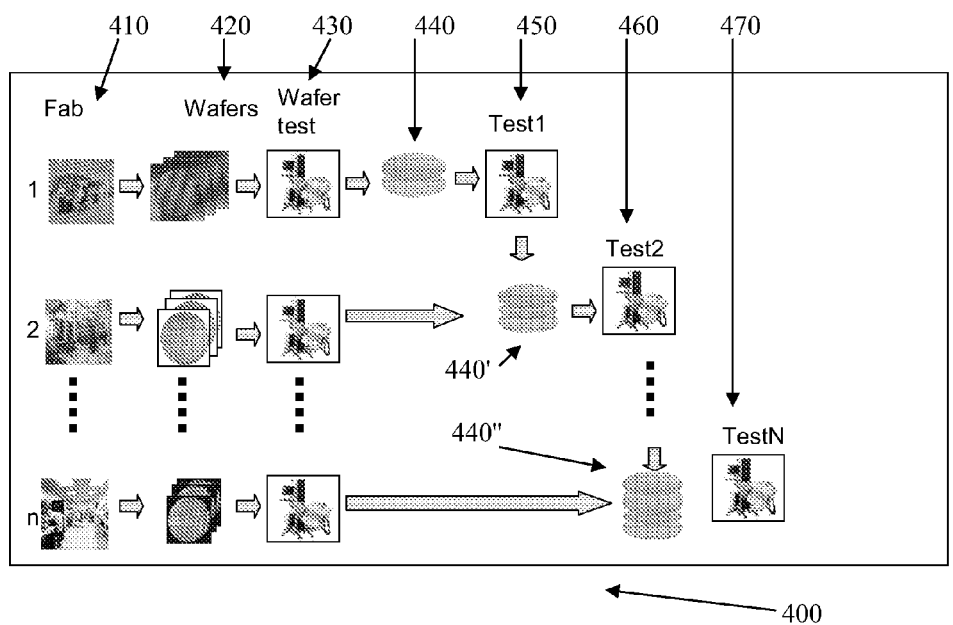
FIG. 4 shows an example manufacturing process flow diagram for producing stacked or three-dimensional ICs that includes testing of partially completed three-dimensional ICs.

Disclosed are systems and methods that allow a three-dimensional IC to be tested at various partial assembly stages to determine the quality of the partially completed IC, for example as shown FIG. 4. In the process flow 400, shown in FIG. 4, fabrication 410 creates silicon wafers 420, which are then tested 430. But then after testing 430, the wafers 420 are then stacked and partially processed 440, 440', 440", and after each partial processing step 440, 440', 440", the increasingly processed wafers are tested any number of times 450, 460, 470. The wafers 420 can be cut or "singulated" into individual stacked or three-dimensional columns of ICs during or after any of these steps. A list 500 of example features or processes that may be used to facilitate testing of partially completed three-dimensional ICs is shown FIG. 5.

4.1 Design for Testing

The first example category of features or processes that may be used to facilitate testing of partially completed three-dimensional ICs is Design for Testing ("DFT") 600. The principles of Design for Testing 600 may be applied to various stages of a partially completed three-dimensional IC as shown and described herein, and as would be apparent to a person of ordinary skill in the art introduced to this idea. Specifically, to implement DFT 600, individual Dice/Wafers may be designed to allow the testing of blocks of the IC from the partially completed IC. This may include individual test blocks being either self-tested or accessible from the partially completed IC. Additionally, DFT architecture may be provided where test circuitry for each block can be accessed from the partially completed IC. DFT architectures like P1687 and IEEE 1149.x, which are known to persons of skill in the art, can be adapted to a partially completed three-dimensional stack of ICs to enable such access.

Figures 1, 6:
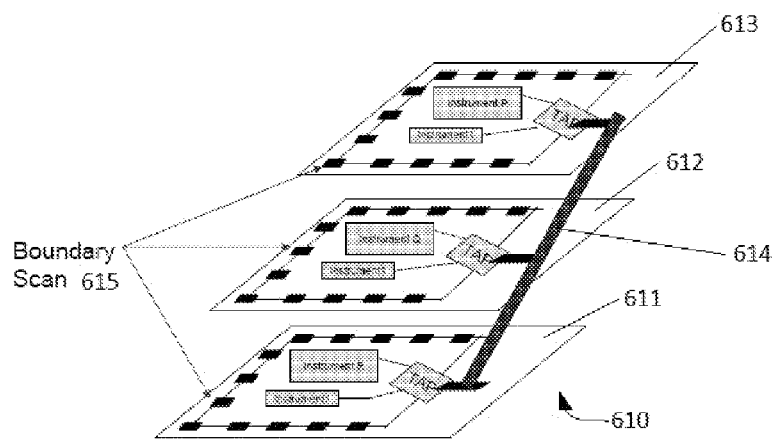
Figures 2, 6:
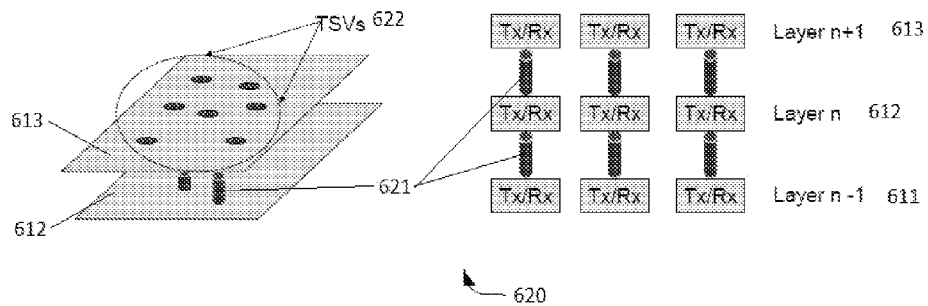
Figures 3, 6:
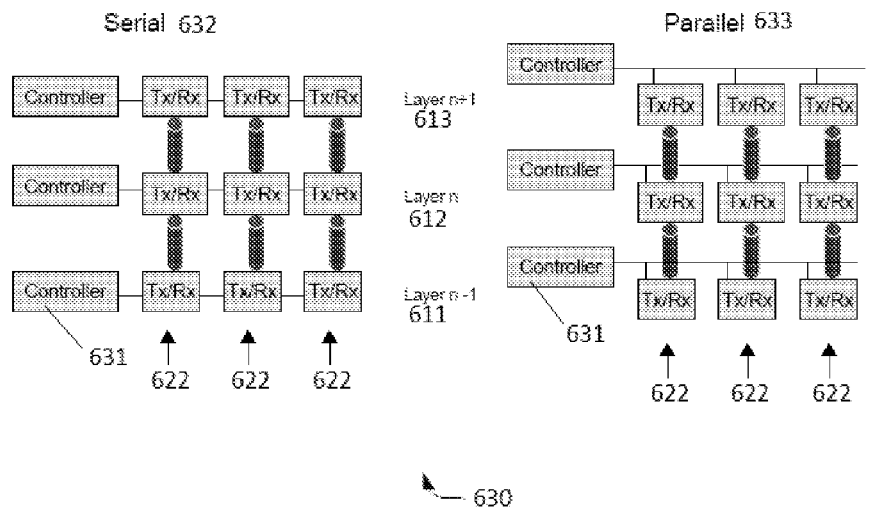
Figures 4, 6:
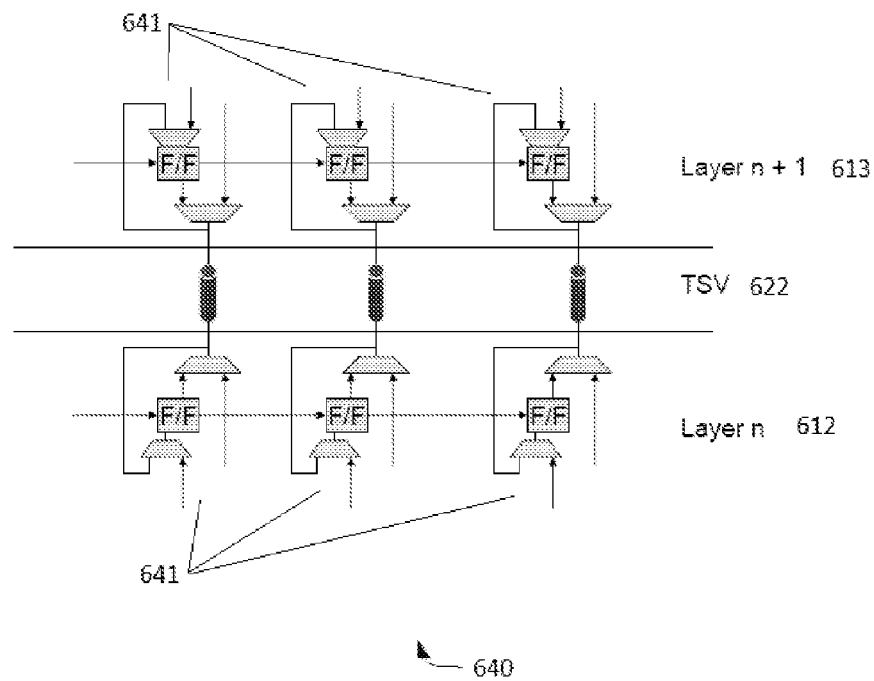
Figures 5, 6:
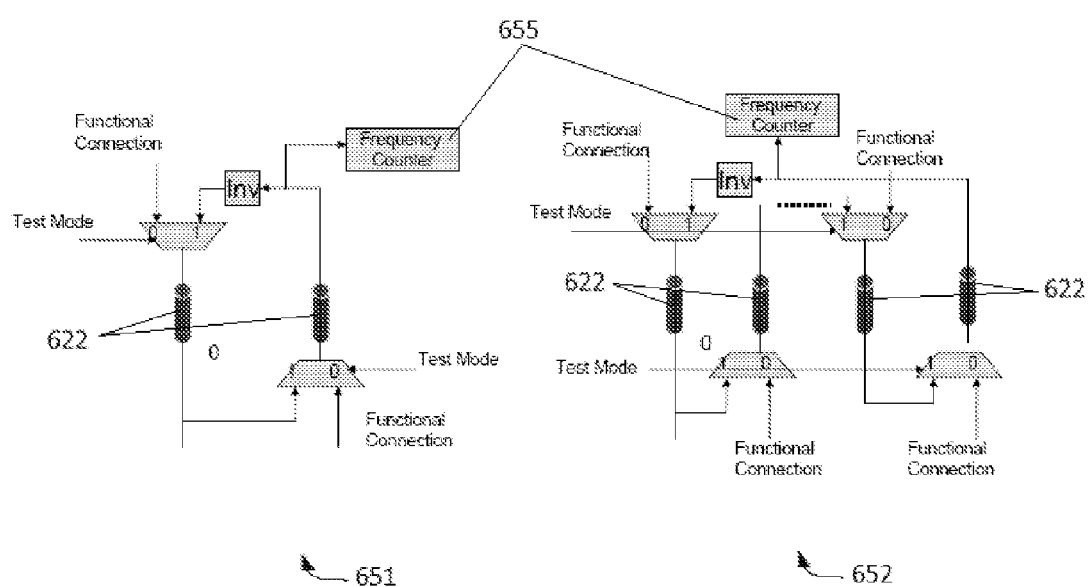

For example, as illustrated in FIG. 6-1, three-dimensional DFT may leverage two-dimensional DFT techniques, including boundary scans 615 of each layer 611, 612, 613 et seq., in a partial stack 610. Also or alternatively, an interconnect 614 may be provided to make the two-dimensional DFT structures on each layer 611, 612, 613 et seq., accessible through a partial stack 610.

Figure 2:
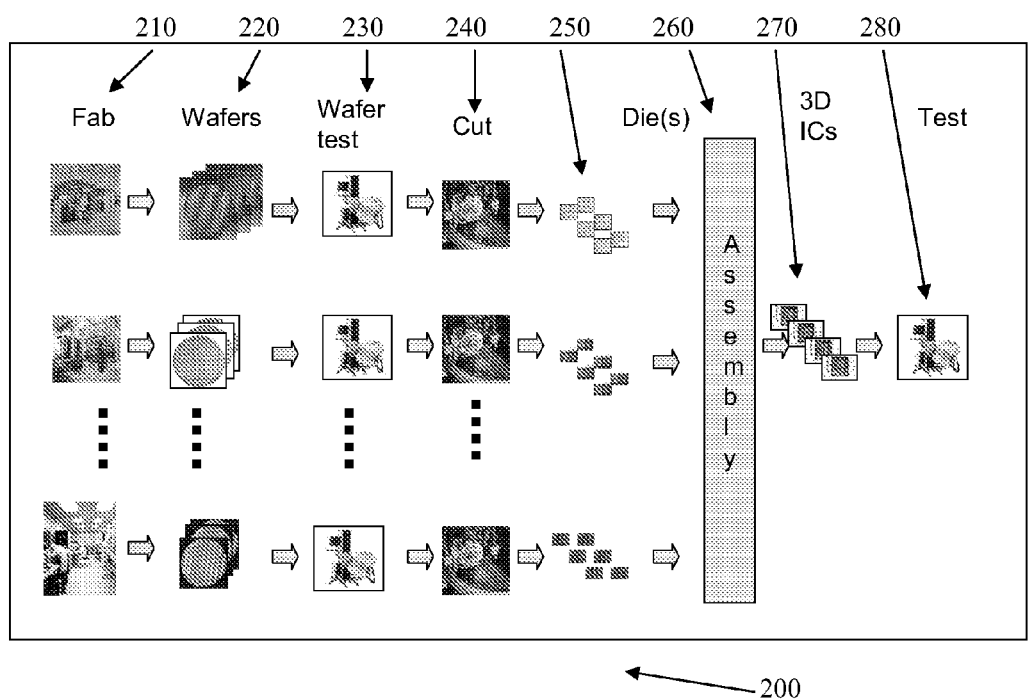
FIG. 2 shows a first example manufacturing process flow diagram for producing stacked or three-dimensional ICs.
Figure 3:
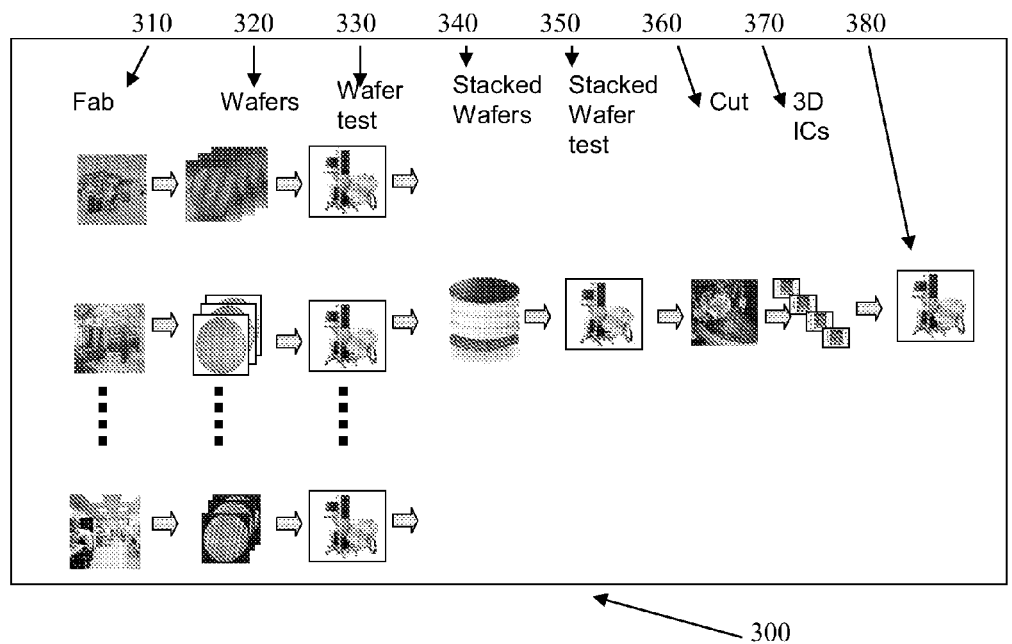
FIG. 3 shows a second example manufacturing process flow diagram for producing stacked or three-dimensional ICs.

Turning to FIG. 6-2, structure 620 is illustrated that provides DFT for interconnect testing of a partial stack of layers 611, 612, 613 et seq. In this example, built in self test (BIST) circuitry 621 may be added on either side of the through silicon vias (TSV) 622. The BIST circuitry 621 may be capable of testing each TSV 622 by applying stimulus to the TSV 622 and capturing and comparing its responses to the stimulus. BIST circuitry 621 may be capable of performing static as well as dynamic tests on the TSVs 622. As shown in FIG. 6-3, structure 630 for DFT for interconnect testing of a partial stack of layers 611, 612, 613 et seq. may be provided with controllers 631 controlling the BIST circuits 621 and corresponding TSVs 622. The connections from the controllers 631 to the BIST/TSV circuits 621/622 may be either serial 632, as in a boundary scan 615, or parallel 633. FIG. 6-4 illustrates DFT interconnect testing, where the testing may be performed through a scan chain 640 of circuits 641.

Figure 5:
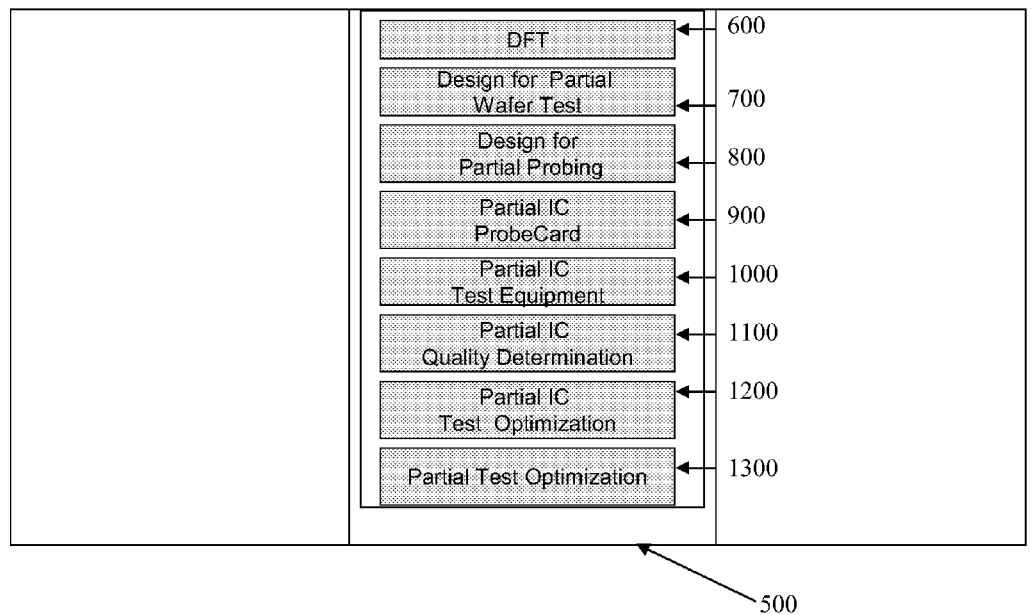
FIG. 5 shows a list of example features or processes that may be used or applied in connection with testing of partially completed three-dimensional ICs.

As shown in FIG. 6-5, DFT 600 may include, for example, structures for oscillation interconnect testing 651, 652. In these examples of oscillation interconnect testing 651, 652, pairs of TSVs 622 are connected in a loop, and a signal with a frequency is applied to the loop, which is counted by a frequency counter 655. A break in the connection can be detected by, for example, a frequency equal to zero. The value of the frequency may also be used to measure the IO performance of the TSVs 622. As shown in structure 652, multiple pairs of TSVs 622 may be put into a loop with a single frequency counter 655.

4.2 Design for Partial Wafer Test

Another feature or process that may be used to facilitate testing of partially completed three-dimensional ICs is Design for Partial Wafer Test (DFPWT) 700. DFPWT 700 may be used to manage the probing complexity to accommodate testing of a partially completed three-dimensional stack of ICs, for example by limiting probing resolution of the physical contactor technology. DFPWT 700 may also be applied to the metal layers, including the metal "1" layer, as that term is understood in the art. For example, in one embodiment DFPWT 700 may be used to implement a metal layer with multiple feature sizes to reduce probing resolution requirements of the physical contactor technology. DFPWT 700 may also be used to create simple circuits. For example, in one embodiment the DFPWT 700 implements a simple device with multiple feature sizes to reduce probing resolution requirements of the physical contactor technology. DFPWT 700 may be implemented on the scribe line, die, or anywhere else on the probecard.

Figures 1, 7:
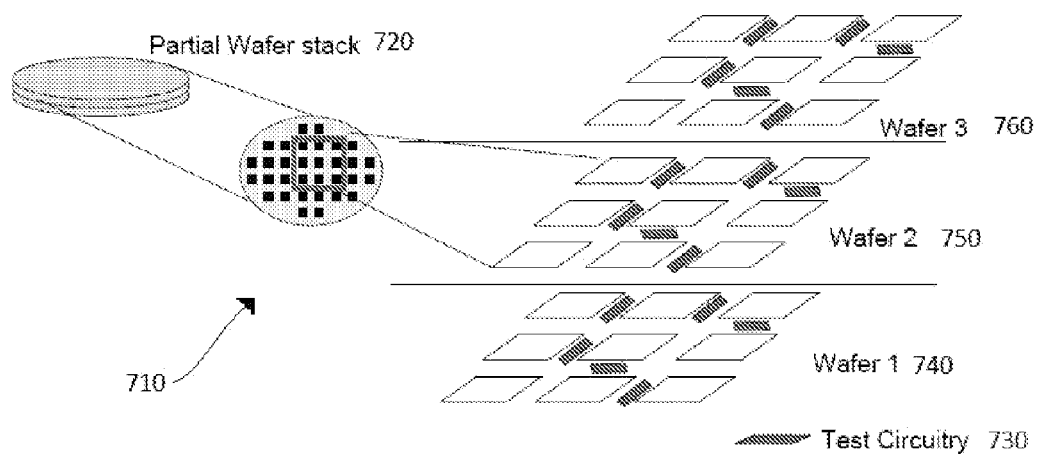
Figures 2, 7:
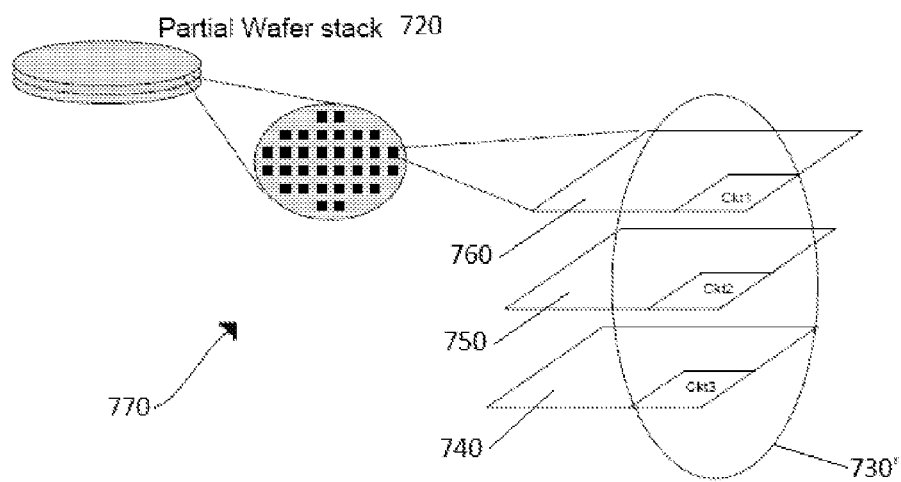

In the example shown in FIG. 7-1, DFPWT 710 provides test circuitry 730 located on the scribe lines (the space between the dice on a wafer), and may be provided, for instance on a middle wafer 750, to test the structures on the wafers above 760 and below 740 in a partial wafer stack 720. The connections between these test circuits and the logic to be tested may be performed via TSVs 622 (not shown in FIG. 7-1) as well. In the example shown in FIG. 7-2, DFPWT 770 provides test circuitry 730' placed on the dice and distributed across many dice 740, 750, 760, et seq. Ckt1, Ckt2 and Ckt3 may implement a part of the test circuitry 730'. Also or alternatively, the various partial circuits, e.g., Ckt1, Ckt2 and Ckt3, may be combined to form a test circuitry 730' in the test of the partial wafer stack 720. Design for wafer testing is discussed in other contexts in U.S. Pat. No. 7,412,639, entitled "System And Method For Testing Circuitry On A Wafer" to Volkerink et al., issued Aug. 12, 2008, which patent is incorporated herein by reference in its entirety.

4.3 Design for Partial Probing

Design for Partial Probing stages 800 is another feature or process that may be used to facilitate testing of partially completed three-dimensional ICs. For example, the present invention contemplates the option of probing at any and all stages, starting for example at the metal 1 layer. However, probing at each and every step of manufacturing takes time and can be costly. Accordingly, it has been determined that probing at only certain optimal stages can save time and cost, i.e., partial probing. The selection of the stages that are probed in partial probing can optionally be optimized based on historical data, either in real time or offline. For instance, algorithms may use defect data to determine the optimal stages to probe. In certain embodiments, selections can be based on studying the defectivity data for each layer, and probing only those layers with relatively high defectivity; by using defect distribution simulation techniques; and by using design information to facilitate likely candidates for probing. Example probing stages may include full wafer, subset of a wafer, scribe-lines, or dies. The probing stages can be either within layers of a die or the die layers in TSV.

4.4 Partial IC Probe Cards

Figure 8:
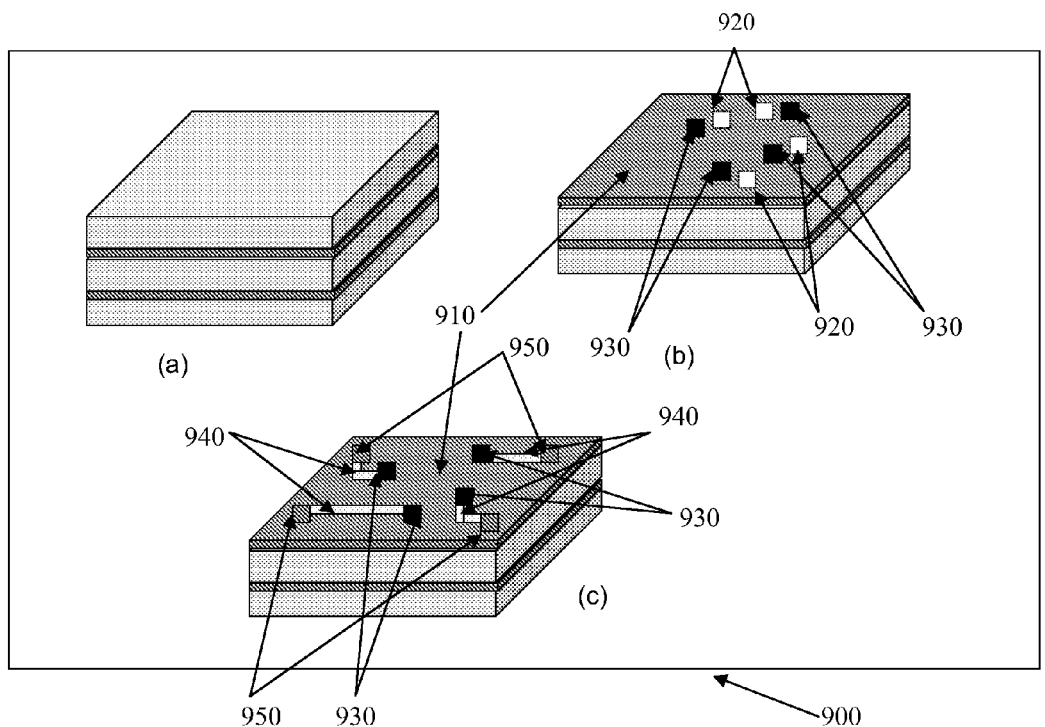
FIG. 8 shows a perspective view of partially completed stacked or three-dimensional ICs with and without extra pads for testing.

A system and method of using Partial IC Probe Cards 900 to facilitate testing of partially completed three-dimensional ICs will now be discussed. Provided is a method to create cost effective means of creating probe cards for partial device probing where not all the layers have been manufactured. For example, as shown in FIG. 8, extra pads 950 may be added on the Re-Distribution Layers (RDLs) 910 that are specially adapted to enable contacting and testing the partial three-dimensional chip. The purpose of the redistribution layer 910 in conventional three-dimensional manufacturing is to do space transformation, i.e., routing the electrical path from the location of the pads on the bottom of the die to the pad locations on the top of the die. For example, in view (b) of FIG. 8, the unshaded pads 920 (which are actually on the bottom side of the redistribution layer 910) represent the pad locations on the die at the bottom, and the darkly shaded pads 930 are the pad locations for the die on the top. Metal lines (not shown) are added inside the RDL to connect the corresponding pad locations 920, 930. This transformation is normally not necessarily designed to allow contacting by external equipment, but rather is designed to just attach the dice. However, in the present system and method extra pads 950 are added that connect to the die pads 930, with the placement of the extra pads 950 being amenable to probing by external equipment, as shown in view (c) of FIG. 8. In other words, the extra pads 950 are added to enable testing of the stack at the partially completed stage. These extra pads 950 are connected to the device pads 930 so the external equipment can test the partial device by applying stimulus and measuring response through the conveniently-placed extra pads 950.

Figure 9:
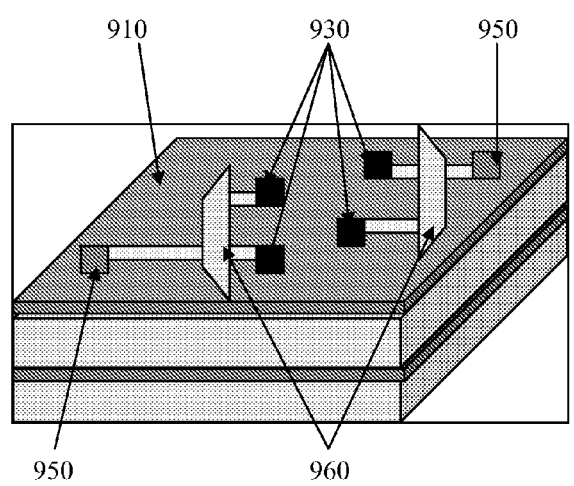
FIG. 9 shows a perspective view of a partially completed stacked or three-dimensional IC with pad-sharing circuitries connected to extra pads for testing.

The addition of extra pads 950 can be modified in various ways to make Partial IC Probe Cards 900 applicable in various situations, as will be apparent to persons of skill in the art, once exposed to this idea. One potential modification includes accommodating pad count restrictions. For example, as shown in FIG. 9, if the area on the RDL 910 limits the number of extra pads 950 that can be added, then the extra pads 950 can be shared among multiple die pads 930 by adding multiplexing and de-multiplexing circuitries 960. Examples of such multiplexing and de-multiplexing circuitries 960 are discussed in other contexts in U.S. Pat. No. 7,137,053, entitled "Bandwidth Matching For Scan Architectures In An Integrated Circuit" to Khoche et al., issued Nov. 14, 2006, and U.S. Pat. No. 7,428,678, entitled "Scan Testing Of Integrated Circuits With High-Speed Serial Interface" to Berndt et al., issued Sep. 23, 2008, both of which patents are incorporated herein by reference in their entireties.

Figure 10:
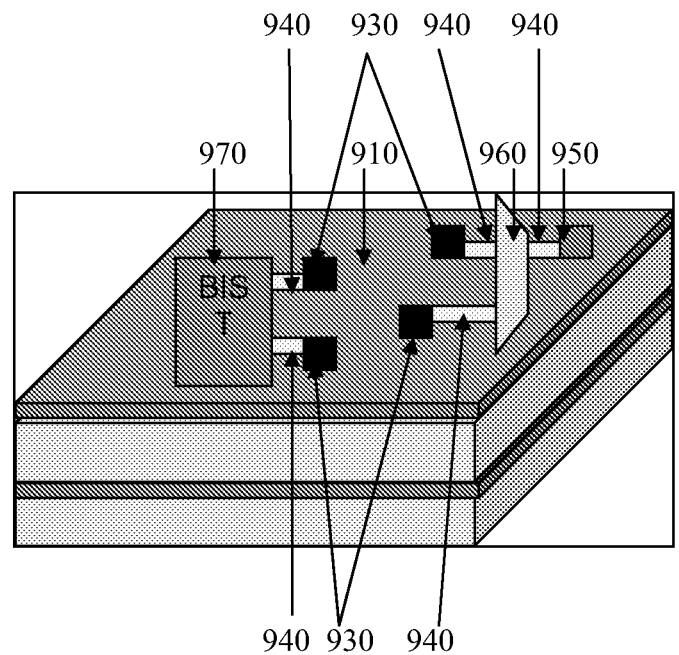
FIG. 10 shows a perspective view of a partially completed stacked or three-dimensional IC with Built In Self testing (BIST) circuitry for self-testing.

Another potential modification to make Partial IC Probe Cards 900 applicable in various situations includes adding DFT along with BIST (known in the art in other contexts) 970 on the RDL layer 910, as shown in FIG. 10. While adding one or more extra pads 950 may provide access to the partial three-dimensional device, one may also add the stimulus generation and response capture circuitry 970 on the RDL layer 910 to avoid the need for extra equipment.

Figure 11:
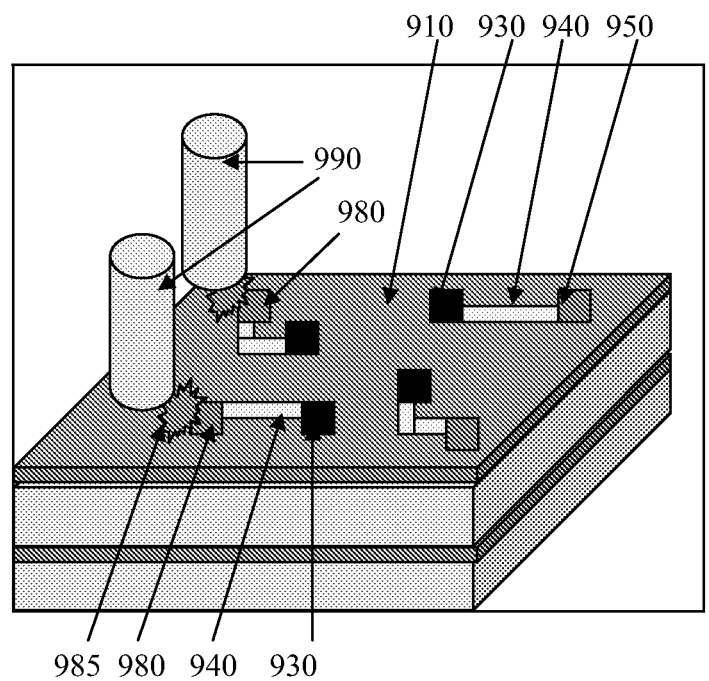
FIG. 11 shows a perspective view of a partially completed stacked or three-dimensional IC with means for optical testing.

Yet another potential modification to Partial IC Probe Cards 900 includes incorporating optical inspection, as shown in FIG. 11. Electro-optic probing includes a class of techniques that rely on the detection of changes in the polarization of an optical beam probe to measure voltage waveforms. Because of the nature of the polarization changes, very high frequency signals can be measured accurately without loading on the circuit, as is known in the art. Optical inspection enables non-contact probing where the equipment does not need to physically touch the pad on the partial device. Applied to the present system and method, extra pads 980 may be attached on RDL 910 that comprise optical transducers that generate light signals 985 from the pads 980 for potential optical inspection by, for instance, light sensors 990. This or any other feature may be used in combination with any other feature, such as extra pads 950, as shown in FIG. 11.

Figure 12:
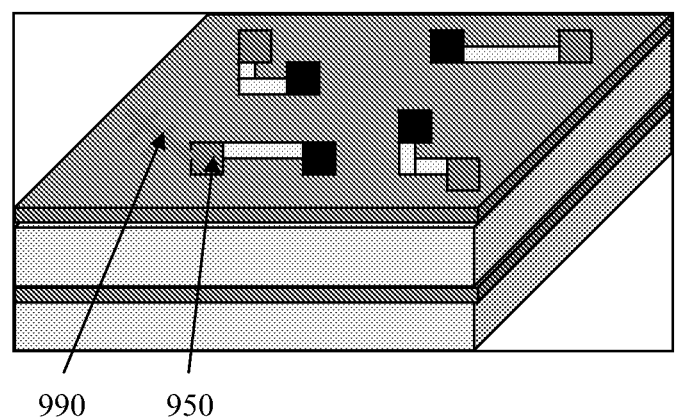
FIG. 12 shows a perspective view of a partially completed stacked or three-dimensional IC with means for RF testing.

Partial IC Probe Cards 900 may also incorporate RF antennas 990, as shown in FIG. 12. One or more of the extra pads 950 can be attached to antennas 990 for radio frequency detection, as shown in FIG. 12. Like optical inspection, RF inspection enables non-contact probing where the equipment does not need to physically touch the pad on the partial device. Examples of such RF antennas 990, which are known in the art in other contexts, are provided in International Published Application No. WO/2008/056739, entitled "System Debug Method, System Debug Apparatus, Data Processor, Wireless Communication Interface IC, And Interface Method" to Iwata et al., published May 15, 2008, which publication is incorporated herein by reference in its entirety.

When designing Partial IC Probe Cards 900, it may be helpful to create and use a standard layout for the extra pads 950. While it is possible to add extra pads 950 at any location on RDL 910 where space is available, it would typically be beneficial to place the extra pads 950 at standard locations. Creating a standard layout enables standard contacting equipment to be used instead of making a custom contacting equipment for each device type.

Figure 13:
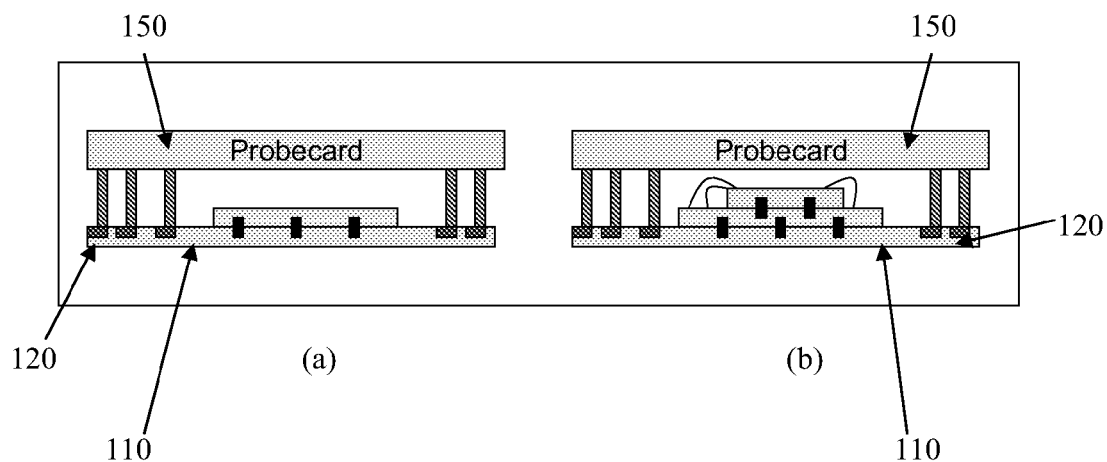
FIG. 13 shows a side view of a standardized probecard testing a partially completed stacked or three-dimensional IC at different stages of manufacture.

In certain embodiments utilizing Partial IC Probe Cards 900, where the three-dimensional stacks 110 are assembled from singulated dice, the device 110 and the contactor 150 can both be designed so that the probing at each partial stage would be done at the bottom most (substrate) layer 120 to avoid the need for separate probe cards 150 for each partial stage. For example, in the embodiment shown in FIG. 13, the same probe card 150 can be used to test the device 110 at both partial assembly stage (a) and subsequent partial assembly stage (b), because the probe card 150 contacts the device 110 at the substrate layer 120 at both stages.

Figure 14:
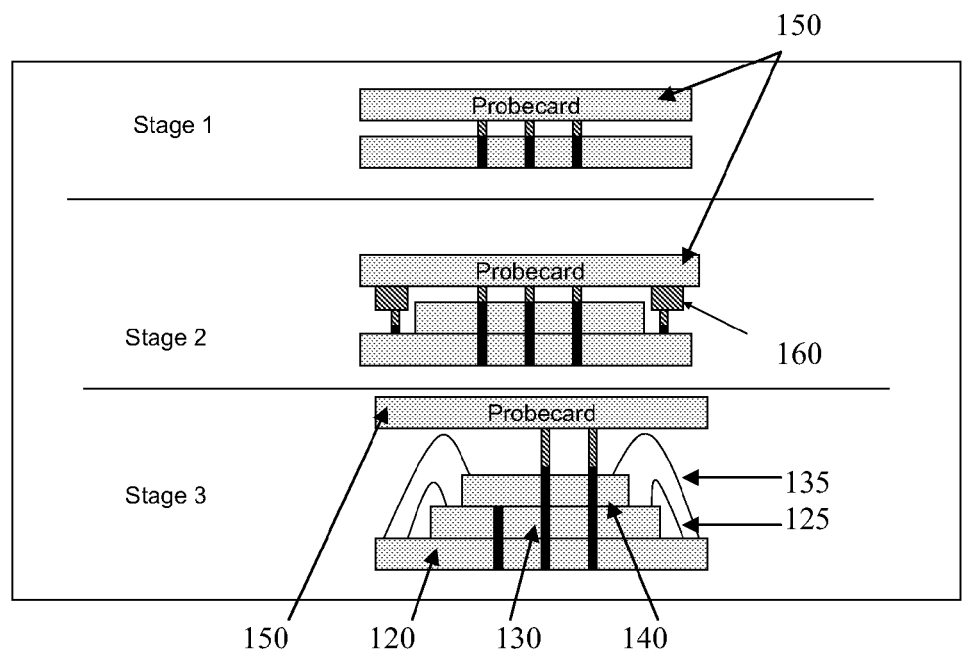
FIG. 14 shows a side view of a standardized probecard with ad-on circuitry testing a partially completed stacked or three-dimensional IC at different stages of manufacture.

As shown in FIG. 14, in other embodiments utilizing Partial IC Probe Cards 900, add-on circuitry 160 can be added to the base probe cards 150 at various stages to enable probing at that stage. Such an arrangement can be used to eliminate the need for a different probe card 150 at each stage of assembly, and could thus reduce the overall cost of probe cards 150. Such embodiments are also useful when some of the pads 930 on some dice 100 in the stacks 110 are not connected all the way through to the top most die, such as top die 140 shown in FIG. 14. In that case, add ons (or bridge circuitry) 125, 135 can be used to contact the pads 120, 130 that are not in the same plane as the topmost dice 140 in the partial stack. Adding circuitry 160 to adjust for the height at each stage can avoid the need for using a new Probe Card 900 at each stage to allow for height differences.

Figure 15:
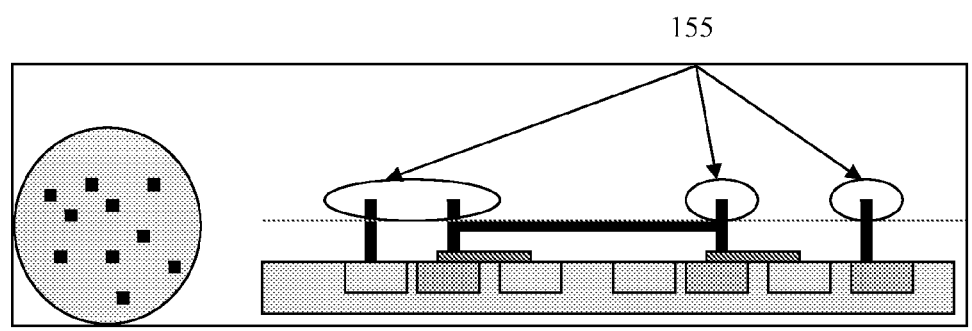
FIG. 15 shows a side and top view of a probe card with features formed from a previous layer mask.

In still other embodiments utilizing Partial IC Probe Cards 900, the probe card 150 could be built using the mask for the next layers to be completed. For example, the locations of the vias that connected the last completed layer can be printed on the probe card surface as the probe tips 155. Alternately, a wafer with those probe tips 155 can be used as a partial probe wafer probe card. The connector to the measurement equipment can then be made using the wafer and TSVs as shown in FIG. 15.

4.5 Partial Wafer/IC Test Equipment

A system and method of using partial IC test equipment 1000 to allow a three-dimensional IC to be tested at various partial assembly stages will now be discussed. In typical three-dimensional IC manufacturing flow 300, shown in FIG. 3, testing 350 is performed at the end of three-dimensional assembly of wafers 340, as previously discussed. The equipment used for assembling the wafers brings a new wafer 320 and assembles it on top of the partially manufactured stack 340. Following are two example ways to enable testing of partial wafers 340 in such flows.

In a first example, the partial wafer stack 340 can be taken off from the assembling equipment (not shown) and then the partial stack 340 can be tested 350 on the conventional test equipment. Such a flow is possible but would be time consuming and may cause additional defects and associated cost due to movement of partial wafers stacks 340 from the controlled environment of the assembly equipment.

In a second alternative using partial IC test equipment 1000, the assembly equipment may be augmented to include testing capability within it, such that the assembly equipment (not shown) can test the partial wafer stack 340 as soon as it is ready without removing it from the controlled environment of the assembly equipment. In various embodiments, equipment that in the past has been separate may be combined into one piece of equipment. This is radically different and new from the current equipment setup where the test equipment and the assembly equipment are separate. In one such embodiment, the new combined assembly and test equipment is capable of assembling and testing multiple partial stacks 340 in parallel.

4.6 Partial IC Quality Determination

Also provided is a system and method of using Partial IC Quality Determination 1100 to allow a three-dimensional IC to be tested at various partial assembly stages. A method is provided for determining the quality of a partial IC with measurements using equipment such as that discussed above.

Adding extra pads 950 as discussed above may facilitate contacting the partial device. But to determine whether the measurement is good or bad requires knowledge of acceptable range and expected behavior. Typically the function of the device is defined at the overall completed device level and not at partial stages. Accordingly, in order to make a determination whether the partial device is good or bad the partial results must be interpolated to full die level accepted domain.

Figure 16:
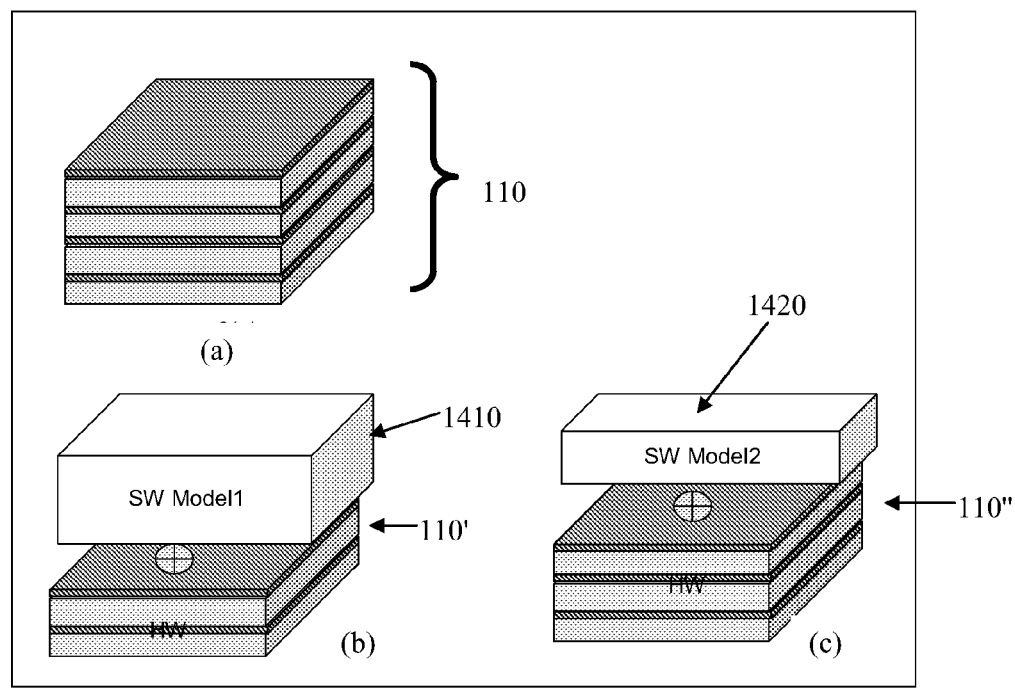
FIG. 16 shows a diagram representing the combination of software models with partially completed stacked or three-dimensional ICs.

One way to handle this problem is to provide Partial IC Quality Determinations 1100 by creating software models to take the place of the layers that have not been manufactured in the device, and then combine the partial measurements with the model for the rest of the device to extrapolate the partial measurements in the full device domain. FIG. 16 shows an example of this system and method, where FIG. 16(a) shows the fully completed device 110, and FIGS. 14(b) and (c) show the partially completed devices 110' and 110" mated with corresponding software models 1410, 1420, respectively. The part of the completed device 110 that is missing in each stage of production is modeled in the corresponding software 1410, 1420, such that the combination of hardware 110', 110" and software 1410, 1420, respectively, can be used to assess the quality of the partial device 110', 110". The missing hardware can be modeled in software using conventional hardware description languages such as Verilog or VHDL, C, System C, or any other suitable software.

The software models 1410, 1420 can reside on the automated test equipment (ATE) or any other components on the path from ATE to the device under test (DUT). During testing, measurements are made on the partially completed wafer/TSV and then the quality of the partially completed device 110', 110" is determined by merging the measurements with the corresponding software model 1410, 1420 and then applying the quality determination criteria on the combined results. Further, the software and electronics for this model can be located anywhere on the information path, for example, on the probecard 150, the connector, and/or the ATE.

Figure 17:
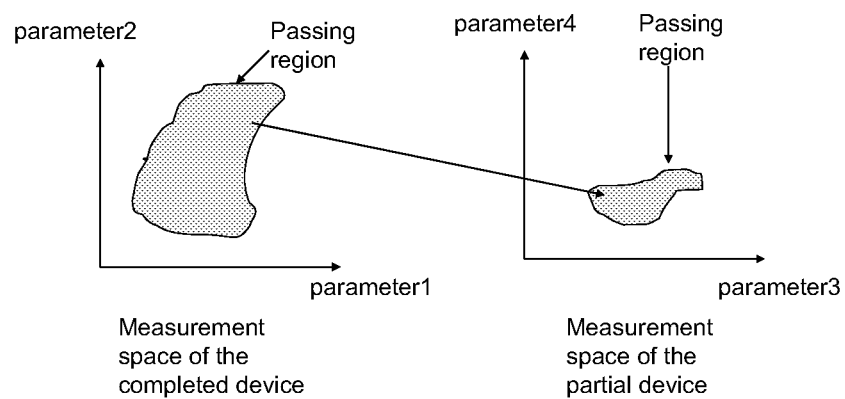
FIG. 17 shows a diagram representing a model based quality determination.

In another embodiment for making Partial IC Quality Determinations 1100, an empirical model for quality determination may be made on just the measurement taken from the partial devices 110', 110". For example, a Design of Experiments (DOE) may be performed on the actual or simulated devices at each stage of manufacturing, and then a model may be created correlating the passing and failing regions on completed devices 110 to the measurements on the partial devices 110', 110" at each layer 100. The measurements on the partial devices may then be compared against the mapped passing/failing regions of the model to make determinations regarding quality. FIG. 17 depicts an example of mapping the measurements on the completed device 110 to measurements taken from a partial device 110' or 110". The passing/failing regions are mapped to the partial device measurement space for faster quality determination. Aspects of these systems and methods are discussed in other contexts in U.S. Pat. No. 7,006,939, entitled "Method And Apparatus For Low Cost Signature Testing For Analog And RF Circuits" to Voorakaranam et al., issued Feb. 28, 2006, and U.S. Pat. No. 7,457,729, entitled "Model Based Testing For Electronic Devices" to Khoche et al., issued Nov. 25, 2008, both of which patents are incorporated herein by reference in their entireties.

Figure 18:
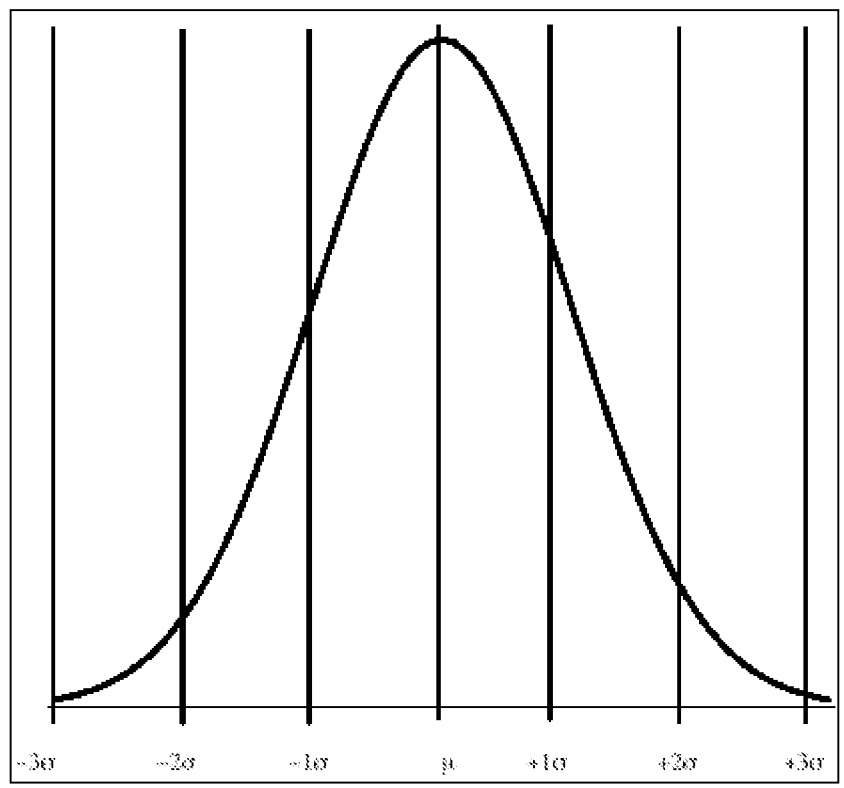
FIG. 18 shows a diagram representing a single variable outlier analysis.

Partial IC Quality Determinations 1100 may also be made using statistical techniques and analysis. For example, algorithms may be used to internally build a histogram to determine outlier criteria. In certain examples, histograms of one or more variables may define a normal distribution as shown in FIG. 18, and outlier criteria may be determined in terms of a certain number of standard deviations from a nominal measurement. Outlier criteria can be tested against a die, wafer, or lot. Such techniques and analyses, including histogram based classification techniques, are known in the art in other contexts, for instance with respect to Iddq testing. Some such techniques are discussed in U.S. Pat. No. 6,941,235, entitled "Method And System For Analyzing Quiescent Power Plane Current (IDDM) Test Data In Very-Large Scale Integrated (VLSI) Circuits" to Gattiker, issued Sep. 6, 2005, which patent is incorporated herein by reference in its entirety.

Figure 19:
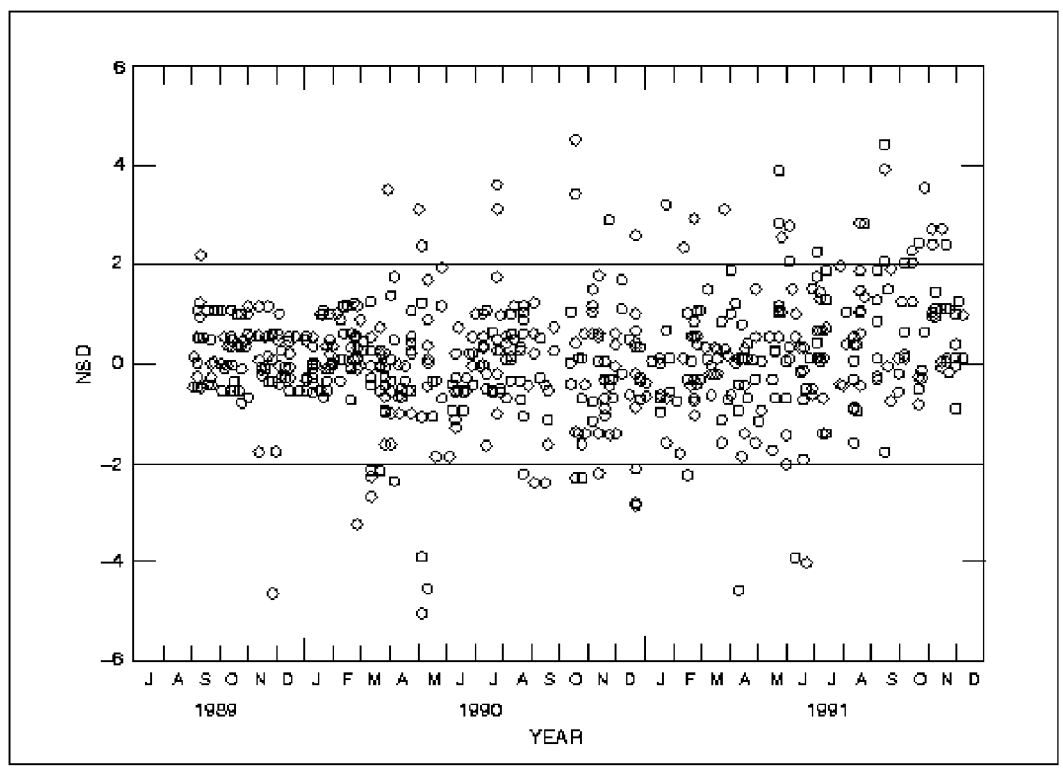
FIG. 19 shows a diagram representing the use of manufacturing history for making a quality determination.

In other embodiments, the threshold criteria can be tested against long term manufacturing trends at various probe stage granularity, such as shown in FIG. 19.

4.7 Partial IC Test Optimization

The system and method described herein enable a three-dimensional IC to be tested at partial manufacturing stages. However, depending on the customer and related test economics a user may desire not to perform testing at all the partial stages all the time.

Accordingly, Partial IC Test Optimization 1200 can be utilized in testing three-dimensional ICs at various partial assembly stages. In one embodiment of Partial IC Test Optimization 1200, a user analyzes the history of the results from the testing at the partial probing stages to see if the IC quality is within the limits, and then reduces the testing at partial stages to sample base testing, thereby reducing the cost of testing the IC by eliminating 100% testing at some or all of the partial stages. In one the embodiment the sampling can be done only on a subset of stages for all the dice. In another embodiment, the sampling can be done on the dice, where only the three-dimensional IC samples are tested at all the partial stages. In another embodiment, the two or more of the sampling methods discussed above can be combined in a test flow. In general, the concepts discussed above with respect to Partial Probing 800, 900 likewise apply here, and are incorporated herein with respect to Partial IC Test Optimization 1200.

4.8 Partial Test Optimization

Also provided is a system and method of using Partial Test Optimization 1300 to allow a three-dimensional IC to be tested at various partial assembly stages. Since the partial wafer stacks 110', 110" are not a complete product and hence do not have a complete function, test program generation cannot be done in a traditional way. Accordingly, multiple methods are described below to solve this problem.

A test program for parametric tests can be generated using the model of the partial wafer. The bounds on the measurements of devices can be determined either by the simulation or by creating rainbow lots where sample wafers are built to understand the variation due to the process.

Partial functional tests can be developed by combining the partial test measurements with the software/hardware model of the remaining layers (discussed above with reference to FIG. 16) to determine the functional response. The pass/fail decision may then be made based on the functional response from the software models 1410, 1420 combined with measurements from the corresponding partial stacks, 110', 110".

The test program for the components testing using Structural BIST techniques can be generated by accessing the BIST circuitry from the partial stacks pads such that the pass/fail decision is made by the BIST itself, for instance as discussed above with respect to FIG. 10.

Additionally, an offline program may be used to generate optimal equipment configurations (e.g., material flow analysis, operations research) to improve the overall cost of test. In certain embodiments, one or more of the algorithms may build an internal model of the other manufacturing steps in order to improve the effectiveness of the other algorithms.

Although exemplary embodiments and applications of the invention have been described herein, there is no intention that the invention be limited to these exemplary embodiments and applications or to the manner in which the exemplary embodiments and applications operate or are described herein. Indeed, many variations and modifications to the exemplary embodiments are possible. For example, although each of the embodiments is described herein in the context of testing semiconductor dies, the invention is not so limited but is applicable to any apparatus, system, or scenario in which a device is tested or monitored by probing the device.

The invention claimed is:

1. A partially assembled three-dimensional integrated circuit (3DIC), comprising: a plurality of individual integrated circuits (IC) that are stacked on each other, and one or more design for testing means (DFT means) applied to one or more of the plurality of individual ICs, the DFT means being adapted to permit the 3DIC to be tested while it is partially assembled.

2. The 3DIC of claim 1, where the DFT means comprises means for performing boundary scans of one or more of the plurality of individual ICs.

3. The 3DIC of claim 1, where the DFT means comprises an interconnect, the interconnect electronically linking two or more of the plurality of individual ICs, and adapted to be accessible for testing when the 3DIC is partially assembled.

4. The 3DIC of claim 1, where the DFT means comprises built in self test (BIST) circuitry.

5. The 3DIC of claim 4, where the BIST circuitry is in electrical communication with one or more of the plurality of individual ICs through silicon vias (TSVs).

6. The 3DIC of claim 4, where the BIST circuitry comprises one or more controllers adapted to control the BIST circuitry.

7. The 3DIC of claim 1, where the DFT means comprises means for testing through a scan chain of circuits.

8. The 3DIC of claim 1, where the DFT means comprises oscillation interconnect testing circuitry.

9. A method of testing a partially assembled three-dimensional integrated circuit (3DIC) comprising a plurality of individual integrated circuits (IC) that are stacked on each other, the method comprising: applying one or more design for testing means (DFT means) to one or more of the plurality of individual ICs, and testing the 3DIC while it is partially assembled.

10. The method of claim 9, where the DFT means comprises means for performing boundary scans of one or more of the plurality of individual ICs.

11. The method of claim 9, where the DFT means comprises an interconnect, the interconnect electronically linking two or more of the plurality of individual ICs, and adapted to be accessible for testing when the 3DIC is partially assembled.

12. The method of claim 9, where the DFT means comprises built in self test (BIST) circuitry.

13. The method of claim 12, where the BIST circuitry is in electrical communication with one or more of the plurality of individual ICs through silicon vias (TSVs).

14. The method of claim 12, where the BIST circuitry comprises one or more controllers adapted to control the BIST circuitry.

15. The method of claim 9, where the DFT means comprises means for testing through a scan chain of circuits.

16. The method of claim 9, where the DFT means comprises oscillation interconnect testing circuitry.

17. A method of testing a partially assembled three-dimensional integrated circuit (3DIC) comprising a plurality of individual integrated circuits (IC) that are stacked on each other, the method comprising: selecting one or more stages of completion at which the 3DIC should be tested by performing one or more design for partial probing steps (DFPP steps), and testing the 3DIC at those one or more stages of completion.

18. The method of claim 17, where the DFPP steps include steps for optimizing based on historical data.

19. The method of claim 18, where the steps for optimizing based on historical data includes studying defectivity data.

20. The method of claim 17, where the DFPP steps include simulation of testing using statistical techniques.

21. The method of claim 20, where the simulation of testing is based at least in part on the design of the 3DIC.

* * * * *